(12) United States Patent
Bingham

(10) Patent No.: US 6,771,125 B2
(45) Date of Patent: Aug. 3, 2004

(54) TUNING FEED-FORWARD AMPLIFIERS AND THE LIKE

(75) Inventor: James A. Bingham, Westerville, OH (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/374,642

(22) Filed: Feb. 26, 2003

(65) Prior Publication Data
US 2003/0164732 A1 Sep. 4, 2003

Related U.S. Application Data

(60) Provisional application No. 60/361,119, filed on Mar. 1, 2002.

(51) Int. Cl.[7] ................................................. H03F 1/00
(52) U.S. Cl. ....................................... 330/151; 330/149
(58) Field of Search ................................ 330/149, 151; 375/297; 455/63

(56) References Cited

U.S. PATENT DOCUMENTS

| | | | | |
|---|---|---|---|---|
| 4,394,624 A | * | 7/1983 | Bauman | ...................... 330/151 |
| 6,091,297 A | | 7/2000 | Bar-David et al. | .......... 330/149 |
| 6,232,838 B1 | * | 5/2001 | Sugimoto | .................... 330/151 |
| 6,531,918 B1 | * | 3/2003 | Posner et al. | ............... 330/151 |
| 2003/0034834 A1 | | 2/2003 | Blodgett | ....................... 330/52 |

* cited by examiner

*Primary Examiner*—Henry Choe
(74) *Attorney, Agent, or Firm*—Steve Mendelsohn

(57) ABSTRACT

Signal handling equipment, such as a high power amplifier, is implemented with feed-forward compensation circuitry that adjusts the effective operation of the equipment (e.g., linearizes the amplifier). The compensation circuitry includes (i) a nulling loop, which generates an error signal based on the output from the amplifier, and (ii) an error loop, which generates, based on the error signal, a feed-forward compensation signal that is added to the output of the amplifier. The compensation circuitry is tuned by tuning the nulling loop and then iteratively tuning the error loop based on data generated by perturbing the tuning of the nulling loop. In one implementation, data corresponding to the amplitude of the output signal is analyzed to generate metric values that are used to iteratively adjust the tuning of the error loop.

21 Claims, 4 Drawing Sheets

TUNING FEED-FORWARD AMPLIFIERS AND THE LIKE

CROSS-REFERENCE TO RELATED APPLICATIONS

This application claims the benefit of the filing date of U.S. provisional application No. 60/361,119, filed on Mar. 1, 2002.

FIELD OF THE INVENTION

The present invention relates to signal processing, and, in particular, to techniques for tuning amplifiers that employ feed-forward compensation.

BACKGROUND OF THE INVENTION

Amplifiers, such as high-power amplifiers used in the base stations of wireless communication systems, typically exhibit non-linearity over their operating ranges. This non-linearity can result in noise that can corrupt or otherwise interfere with the communications. To address this problem, additional circuitry may be added to an amplifier in an attempt to linearize the effective amplifier response. Conventional techniques for linearizing amplifiers typically involve pre-compensation and/or feed-forward compensation.

In amplifier linearization based on pre-compensation, the input signal that is to be amplified is pre-distorted prior to being applied to the amplifier in order to adjust the input signal based on known non-linearities in the amplifier transfer function. In feed-forward compensation, an error signal is fed forward and combined with the output of the amplifier to adjust the output signal for non-linearities in the amplifier transfer function.

FIG. 1 shows a high-level block diagram of a linearized amplifier circuit 100 according to the prior art. Amplifier circuit 100 utilizes feed-forward compensation to linearize the response of a high-power amplifier (HPA) 108. Amplifier circuit 100 has a main amplifying chain and an error amplifier chain. The main amplifying chain includes adjuster 102, HPA 108, tap 110, delay module 112, and coupler 114, while the error amplifier chain includes delay module 122, coupler 124, adjuster 130, and error amplifier (EA) 132. In addition, amplifier circuit 100 includes splitter 120, pilot generator 104, coupler 106, taps 116 and 126, and detectors 118 and 128. Depending on the application, adjusters 102 and 130 may typically be implemented using vector modulators.

In operation, an input signal is split at splitter 120 and applied to both adjuster 102 and delay module 122. In the main amplifying chain, the amplitude and/or phase of the signal from splitter 120 are (optionally) adjusted prior to being applied to HPA 108. If pilot generator 104 is activated, then a pilot signal is injected into the signal at coupler 106 prior to being applied to HPA 108. A portion of the amplified signal generated by HPA 108 is tapped off at tap 110 and the rest is delayed at delay module 112 (to compensate for the timing of the corresponding portion of the error amplifier chain). A feed-forward error-compensation signal (described below) from EA 132 is added to the delayed, amplified signal from delay module 112 at coupler 114 and the resulting compensated signal is provided as the output signal from amplifier circuit 100. Detector 118 monitors a sample of the output sample received from tap 116.

In the error amplifier chain, the signal from splitter 120 is delayed by delay module 122 (to compensate for the timing of the corresponding portion of the main amplifying chain). At coupler 124, the portion of the amplified signal received from tap 110 is subtracted from the delayed signal from delay module 122 to generate an error signal. Adjuster 130 (optionally) adjusts the amplitude and/or phase of the error signal prior to application to EA 132. The amplified output from EA 132 is the feed-forward error-compensation signal that is added to the delayed, amplified signal from delay module 112 at coupler 114 to generate the output signal. Detector 128 monitors a sample of the error signal received from tap 126 prior to the error signal being applied to adjuster 130.

As indicated in FIG. 1, amplifier circuit 100 has two loops: a nulling loop (i.e., Loop 1 in FIG. 1) and an error loop (i.e., Loop 2 in FIG. 1). According to the prior art, amplifier circuit 100 is tuned by first tuning the nulling loop and then tuning the error loop. In particular, the nulling loop is tuned by applying an input signal to amplifier circuit 100 (with pilot generator 104 turned off) and using nulling-loop adjuster 102 to adjust the amplitude and/or phase of its applied signal until the power of the error signal detected by detector 128 is minimized. After the nulling loop has been tuned and with the input signal typically still present, the error loop is then tuned by (i) injecting a known pilot signal (e.g., one or more continuous wave (CW) signals or a spread-spectrum signal) from pilot generator 104 at coupler 106 and, (ii) with nulling-loop adjuster 102 locked to its tuned setting, using error-loop adjuster 130 to adjust the amplitude and/or phase of the signal in the error amplifier until the power of the pilot signal detected by detector 118 is minimized (e.g., ideally zero).

In order to maintain tuning of a real-world amplifier system in which operating characteristics vary over time with changes in the input signal, the ambient temperature and humidity, and the like, the system-tuning process consisting of first tuning the nulling loop followed by tuning of the error loop is typically continuously or at least periodically repeated to dynamically adjust the operations of amplifier circuit 100.

In order for detector 118 to be able to distinguish the presence of the amplified pilot signal from the amplified input signal, the pilot signal injected at coupler 106 must be different in some way from the input signal. In some prior art implementations, pilot generator 104 is designed to generate the pilot signal as a CW signal having a frequency different from those frequencies contained in the input signal. In this case, detector 118 is typically implemented as a narrow-band detector that is able to detect the presence of the amplified CW pilot signal in the otherwise wide-band output signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
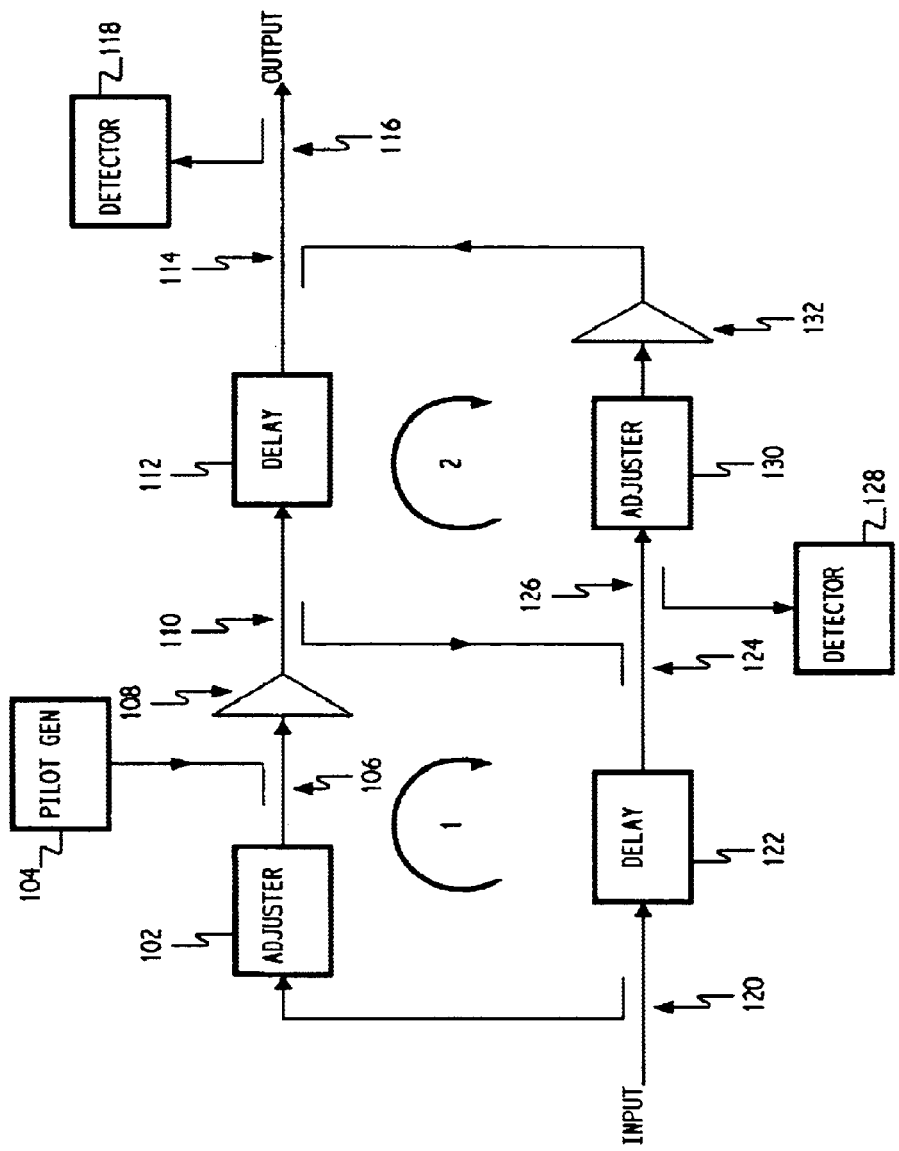
FIG. 1 is a high-level block diagram of a linearized amplifier circuit of the prior art.
Figure 2:
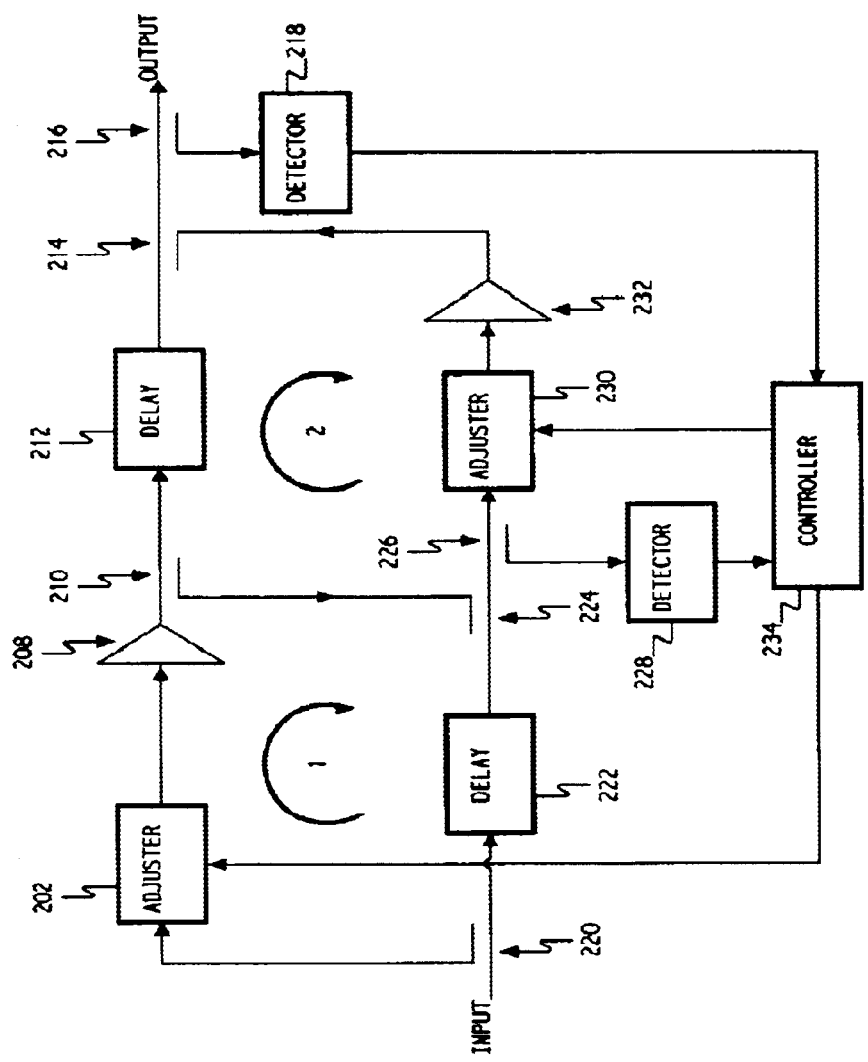
FIG. 2 shows a high-level block diagram of a linearized amplifier circuit, according to one embodiment of the present invention.

FIG. 2 shows a high-level block diagram of a linearized amplifier circuit 200, according to one embodiment of the present invention. Like prior-art amplifier circuit 100 of FIG. 1, amplifier circuit 200 utilizes feed-forward compensation to linearize the response of a high-power amplifier 208. Moreover, like amplifier circuit 100, amplifier circuit 200 has a main amplifying chain and an error amplifier chain that, together, form a nulling loop (i.e., Loop 1 in FIG. 2) and an error loop (i.e., Loop 2 in FIG. 2). In fact, the overall architecture of amplifier circuit 200 is similar to that of amplifier circuit 100, with corresponding elements similarly labeled (e.g., splitter 220 of amplifier circuit 200 corresponds to splitter 120 of amplifier circuit 100). One difference, however, between amplifier circuit 200 and amplifier circuit 100 is that amplifier circuit 200 does not have a pilot generator and coupler analogous to pilot generator 104 and coupler 106 of amplifier circuit 100. Another difference, as described below, is that detector 218 of FIG. 2 is preferably implemented using a wide-band detector. FIG. 2 also shows controller 234, which receives (amplitude or power level) data from detectors 218 and 228 and uses that data to control the operations of adjusters 202 and 230, which, depending on the implementation, could be (I, Q)-vector modulators or gain-and-phase adjusters.

Other than the absence of the ability to inject a pilot signal into the signal applied to the high-power amplifier in the main amplifying chain, the signal processing implemented in the main amplifying chain and the error amplifier chain of amplifier circuit 200 is substantially analogous to the signal processing implemented in the main amplifying chain and the error amplifier chain of amplifier circuit 100. What differs is the preferred method by which amplifier circuit 200 is tuned.

Figure 3:
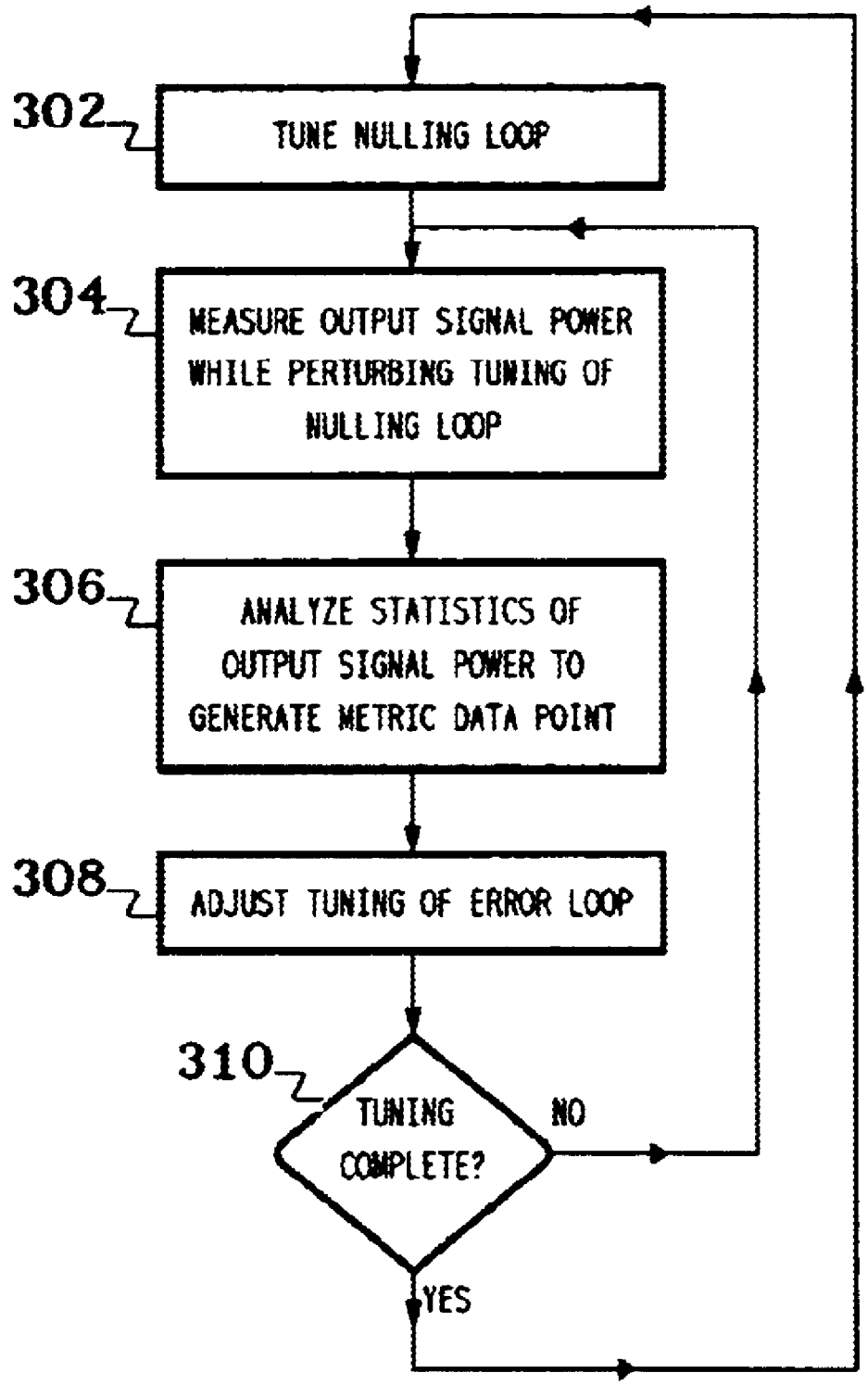
FIG. 3 is a flow diagram of the method for tuning the amplifier circuit of FIG. 2, according to one embodiment of the present invention.

FIG. 3 shows a flow diagram of the method for tuning amplifier circuit 200 of FIG. 2, as controlled and implemented by controller 234, according to one embodiment of the present invention. As indicated in FIG. 3, this tuning method is an iterative method, in which, after the nulling loop is tuned, the error loop is iteratively tuned based on data generated by perturbing the tuning of the nulling loop. Each set of perturbations to the nulling loop tuning is used to generate a data point for a metric that characterizes the effect perturbing the nulling loop has on the error loop for a current setting of error-loop adjuster 230. After each set of perturbations to the nulling loop, the tuning of the error loop is adjusted by adjusting the setting of error-loop adjuster 230, preferably based on the current set of generated metric data points. The process of perturbing the nulling loop, calculating another metric data point, and adjusting the error-loop tuning is repeated until it is determined that the error loop is sufficiently tuned. At that time (or any time thereafter), the entire process can be repeated by re-tuning the nulling loop and iteratively re-tuning the error loop.

In particular, the tuning method of FIG. 3 begins by tuning the nulling loop (step 302). In a preferred implementation, the nulling loop is tuned in the same way that the nulling loop of prior art amplifier circuit 100 of FIG. 1 is tuned. In particular, with an input signal applied, the amplitude and/or phase (or, alternatively, the quadrature and in-phase components) of the signal applied to HPA 208 are adjusted using nulling-loop adjuster 202 until the power of the error signal detected by detector 228 is minimized. The quadrature and in-phase settings of nulling-loop adjuster 202 at which the power of the error signal is minimized are referred to herein as the tuned nulling-loop settings ($Q_N^T$, $I_N^T$) of nulling-loop adjuster 202.

After step 302 is completed and with an input signal applied, the power of the output signal is monitored using detector 218 while the tuning of the nulling loop is perturbed (step 304). In particular, during step 304, the amplitude and/or phase settings of nulling-loop adjuster 202 are perturbed from the settings determined in step 302. In one possible implementation, the quadrature (Q) and in-phase (I) components of the signal applied to HPA 208 are perturbed using nulling-loop adjuster 202 to add and/or subtract, in one or more combinations, quadrature and in-phase deviations ($\Delta Q$, $\Delta I$) to and/or from the tuned nulling-loop quadrature and in-phase settings ($Q_N^T$, $I_N^T$) derived during step 302, while monitoring the output signal power F using detector 218. The following Table I shows some of the different combinations of quadrature and in-phase settings that can be applied during step 304. In Table I, the function $F_E(Q_N, I_N)$ corresponds to the output signal power when nulling-loop adjuster 202 is set to ($Q_N$, $I_N$) and error-loop adjuster 230 is set to ($Q_E$, $I_E$).

TABLE I

| | $I_N^T - \Delta I$ | $I_N^T$ | $I_N^T + \Delta I$ |
|---|---|---|---|
| $Q_N^T - \Delta Q$ | $F_E(Q_N^T - \Delta Q, I_N^T - \Delta I)$ | $F_E(Q_N^T - \Delta Q, I_N^T)$ | $F_E(Q_N^T - \Delta Q, I_N^T + \Delta I)$ |
| $Q_N^T$ | $F_E(Q_N^T, I_N^T - \Delta I)$ | $F_E(Q_N^T, I_N^T)$ | $F_E(Q_N^T, I_N^T + \Delta I)$ |
| $Q_N^T + \Delta Q$ | $F_E(Q_N^T + \Delta Q, I_N^T - \Delta I)$ | $F_E(Q_N^T + \Delta Q, I_N^T)$ | $F_E(Q_N^T + \Delta Q, I_N^T + \Delta I)$ |

The magnitude of the $\Delta I$ deviation, and analogously the $\Delta Q$ deviation, is preferably selected to satisfy the relation of Equation (1) as follows:

$$0.1 \geq \left| 10 * \log\left(\frac{|\vec{G} + \overline{\Delta I}|}{|\vec{G}|}\right) \right|, \quad (1)$$

where $\overrightarrow{\Delta I}$ is the vector corresponding to the $\Delta I$ deviation and $\vec{G}$ is the vector corresponding to the quadrature and in-phase settings ($Q_N^T$, $I_N^T$) for the tuned nulling-loop.

The output signal power levels measured during the perturbations of step 304 are statistically analyzed to generate a metric that characterizes the effect perturbing the nulling loop has on the error loop (step 306). The following Equation (2) shows one possible metric $M_E$ for this step:

$$M_E = \sum_{i=-1}^{+1} \left\{ \sum_{j=-1}^{+1} [F_E(Q_N^T + i \cdot \Delta Q, I_N^T + j \cdot \Delta I) - F_E(Q_N^T, I_N^T)]^2 \right\}. \quad (2)$$

The statistical analysis of step 306 provides a single value of metric $M_E$ corresponding to the current quadrature and in-phase settings ($Q_E$, $I_E$) of error-loop adjuster 230.

Figure 4:
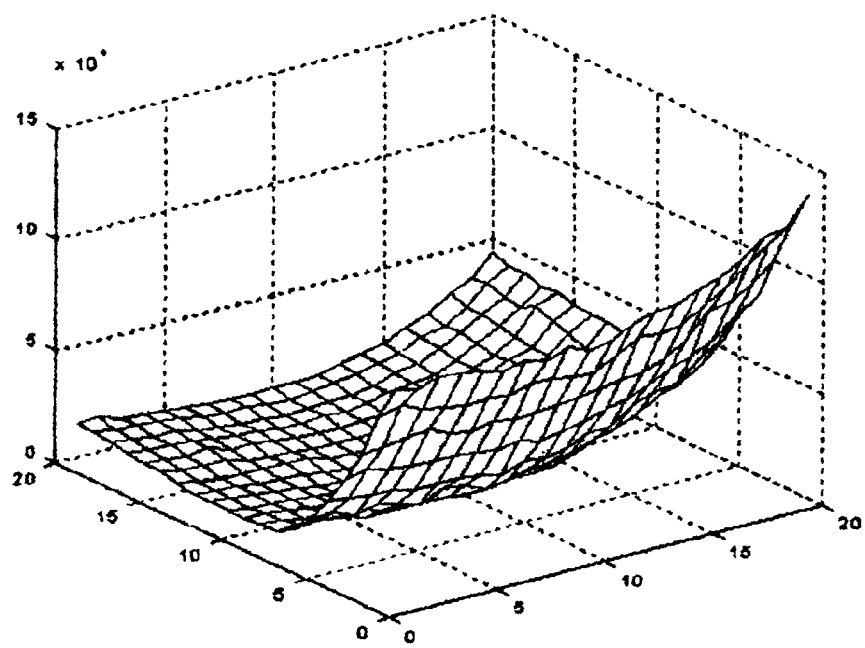
FIG. 4 shows a plot of metric $M_E$ of Equation (1) as a function of the quadrature and in-phase settings ($Q_E$, $I_E$) of the error-loop adjuster for an exemplary implementation of the amplifier circuit of FIG. 2.

FIG. 4 shows a plot of metric $M_E$ of Equation (2) as a function of the quadrature and in-phase settings ($Q_E$, $I_E$) of error-loop adjuster 230 for an exemplary implementation of amplifier circuit 200, where the quadrature and in-phase settings are expressed in units of approximately 0.1 dB in Equation (1).

Those skilled in the art will understand that the present invention can be implemented using other sets or types of perturbations and/or other metrics. For example, rather than using $\Delta Q$ and $\Delta I$ deviations, the perturbations could be made directly to the magnitude and phase of the error signal. As for different metrics, a metric similar to metric $M_E$ could be based on Equation (2), where the squared term is replaced by an analogous absolute-valued term. Alternatively, a metric $M_E'$ could be derived using the log of each squared (or absolute-valued) term in Equation (2), such as in the following Equation (3):

$$M_E' = \sum_{i=-1}^{+1} \left\{ \sum_{j=-1}^{+1} [F_E(Q_N^T + i \cdot \Delta Q, I_N^T + j \cdot \Delta I) - F_E(Q_N^T, I_N^T)]^2 \right\}. \quad (3)$$

Figure 5:
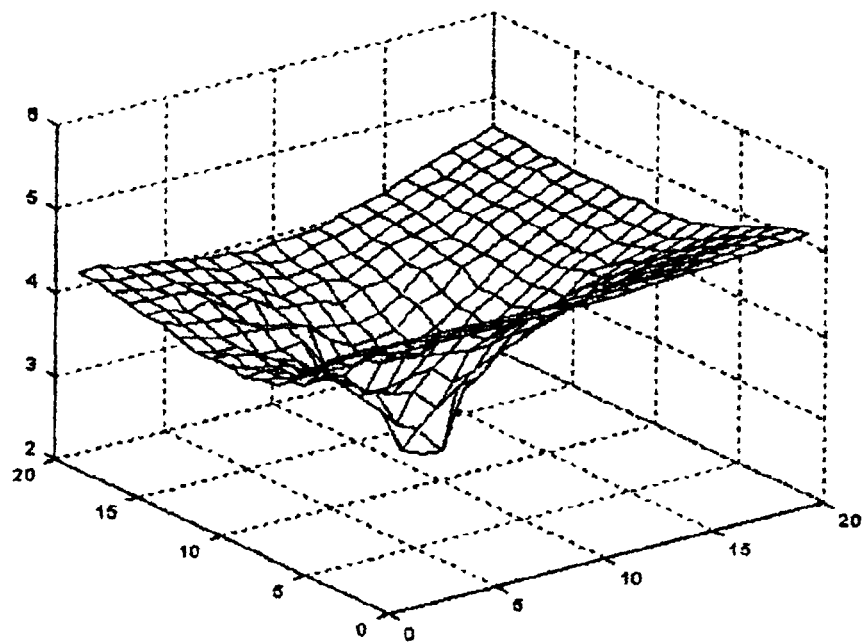
FIG. 5 shows a plot of log-based metric $M_E'$ of Equation (2) as a function of the quadrature and in-phase settings ($Q_E$, $I_E$) of the error-loop adjuster for a similar implementation of the amplifier circuit of FIG. 2.

FIG. 5 shows a plot of log-based metric $M_E'$ of Equation (3) as a function of the quadrature and in-phase settings ($Q_E$, $I_E$) of error-loop adjuster 230 for a similar implementation of amplifier circuit 200.

In general, there exists a value for the quadrature and in-phase settings ($Q_E$, $I_E$) of error-loop adjuster 230 for which the metric (either $M_E$ of Equation (1) or $M_E'$ of Equation (3)) is minimized. In FIG. 5, this value corresponds to the center of the "hole" at about ($Q_E$, $I_E$)=(13, 11). This value corresponds to the situation in which the tuning of the error loop is such that perturbations on the tuned nulling loop have minimal effect on the power of the output signal generated by amplifier circuit 200. When this condition is (at least substantially) achieved, the error loop is said to be tuned.

Referring again to FIG. 3, after generating in step 306 a new value of the metric corresponding to the current setting of error-loop adjuster 230, the tuning of the error loop is adjusted in step 308. In general, this step involves adjusting the settings ($Q_E$, $I_E$) of error-loop adjuster 230 based on the one or more metric values generated during the one or more previous implementations of step 306. In particular, the tuning of the error loop is preferably adjusted based on the gradient of the metric data points as determined from previous adjustments in order to minimize the metric value. Since, after the first iteration, there is only one metric data point available, the tuning of the error loop can, in theory, be adjusted in a random direction for the second iteration. As can be appreciated by comparing FIGS. 4 and 5, the log-based formula of Equation (3) can provide a more clear solution space for the gradient-based technique.

In a gradient-based technique for updating the tuning of the error loop, the quadrature and in-phase settings ($Q_E$, $I_E$) of error-loop adjuster 230 are ideally adjusted to move the system from, for example, its current location on the three-dimensional curve shown in FIG. 5 towards the location of the center of the hole in that curve. However, at any given time during the iterative tuning process, there are only a finite set of metric data points available (as opposed to the entire 3D curve). As such, the location of the center of the hole is not known. As such, the settings of error-loop adjuster 230 are adjusted based on whatever metric data points are available to make a best estimate of the direction towards the center of the hole.

After adjusting the tuning of the error loop, a test is made to determine whether the tuning of the error loop is complete (step 310). In one implementation, this test may be based on the derivative of the gradient around the current metric point. In another implementation, the test may be based solely on a maximum number of steps. Other tests are possible. If the tuning of the error loop is not complete, then processing returns to step 304 returns to perform another set of perturbations on the tuning of the nulling loop for the new error-loop settings. Otherwise, if the error loop is sufficiently tuned, then processing can return (either immediately or after some time period) to step 302 to start the tuning method all over again, in order to maintain dynamic, real-time tuning of the amplifier circuit. In an alternative implementation, the testing (and branching) of step 310 may be implemented prior to the error-loop adjustment of step 308.

In one possible implementation, the metric data value generated during each iteration is based on all of the perturbations shown in Table I. In an alternative implementation, however, when the magnitudes of the differences between the output signal power for the tuned nulling loop and the output signal power for each perturbed setting of the nulling loop are less than a specified threshold, the iteration processing switches to a finer-tuning mode in which only two perturbations are used to generate each metric data value.

Table II shows the set of power difference magnitudes corresponding to the output signal power values shown in Table I for the full set of perturbations. In typical operations, the two largest power difference magnitudes will fall along a horizontal, diagonal, or vertical line through the center of the table. In that case, those two perturbations are the two that are selected to generate each new metric data value. When the two largest power difference magnitudes do not lie along a line through the center of the table, the two perturbations used to generate each new metric data value can be selected by interpolating between the various values in Table II. Once the two perturbations are selected, they can be used for one or more subsequent iterations without having to reexamine the full set of perturbations of Table I. Depending on the implementation, the full set of perturbations may be reexamined after a specified number of iterations in order to verify that the current selection of two perturbations is still appropriate and update that selection is they are no longer appropriate.

TABLE II

|  | $I_N^T - \Delta I$ | $I_N^T$ | $I_N^T + \Delta I$ |
|---|---|---|---|
| $Q_N^T - \Delta Q$ | $\|F_E(Q_N^T - \Delta Q, I_N^T - \Delta I) - F_E(Q_N^T, I_N^T)\|$ | $\|F_E(Q_N^T - \Delta Q, I_N^T) - F_E(Q_N^T, I_N^T)\|$ | $\|F_E(Q_N^T - \Delta Q, I_N^T + \Delta I) - F_E(Q_N^T, I_N^T)\|$ |
| $Q_N^T$ | $\|F_E(Q_N^T, I_N^T - \Delta I) - F_E(Q_N^T, I_N^T)\|$ | 0 | $\|F_E(Q_N^T, I_N^T + \Delta I) - F_E(Q_N^T, I_N^T)\|$ |
| $Q_N^T + \Delta Q$ | $\|F_E(Q_N^T + \Delta Q, I_N^T - \Delta I) - F_E(Q_N^T, I_N^T)\|$ | $\|F_E(Q_N^T + \Delta Q, I_N^T) - F_E(Q_N^T, I_N^T)\|$ | $\|F_E(Q_N^T + \Delta Q, I_N^T + \Delta I) - F_E(Q_N^T, I_N^T)\|$ |

The two selected perturbations correspond to a perturbation set that will tend to move the iterative process towards the tuned error-loop condition in a more efficient manner than using the entire perturbation set of Table I. Not only will the computation of each metric data value involve less processing, but the sensitivity of the metric data values to changes in the error-loop tuning will be greater for the two-perturbation case than for metric data values generated using the full perturbation set of Table I.

Since amplifier circuit 200 does not rely on the injection of a narrow-band pilot signal, in addition to not needing a pilot signal generator, such as pilot generator 104 of FIG. 1, amplifier circuit 200 can be implemented without using any (relatively expensive) narrow-band detectors. In particular, detectors 218 and 228 can both be implemented using (relatively inexpensive) wide-band detectors, such as envelope, logarithmic envelope, true power, or ratio metric detectors.

Alternative Embodiments

Depending on the particular application, the present invention can be implemented in either the analog or the digital domain using input signals that may be baseband, intermediate frequency (IF), or radio frequency (RF) signals to generate amplified output signals that may analog or digital at baseband, IF, or RF. For example, a digital baseband input signal could be processed to generate an amplified analog RF output signal. Depending on the particular application, the implementation would involve appropriate combinations of analog-to-digital (A/D), digital-to-analog (D/A), and frequency (e.g., baseband to IF/RF or IF/RF to baseband) conversion.

Although the present invention has been described in the context of an amplifier with only feed-forward compensation, the present invention can also be applied to amplifiers having pre-compensation in addition to feed-forward compensation.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks.

Although the present invention has been described in the context of circuitry in which feed-forward compensation is applied to linearize the response of signal handling equipment that is the main amplifier in the main amplifying chain, the present invention is not so limited. In general, the present invention may be employed in any suitable circuitry in which feed-forward compensation is used to adjust the effective operation of signal handling equipment, where the signal handling equipment may be other than an amplifier and the adjustments may be other than linearization.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for tuning a signal processing circuit having signal handling equipment and feed-forward compensation circuitry adapted to generate and apply a feed-forward compensation signal to an output of the signal handling equipment to generate an output signal for the signal processing circuit, the method comprising:
   tuning a nulling loop of the signal processing circuit; and
   iteratively tuning an error loop of the signal processing circuit by:
      generating data corresponding to the output signal from the signal processing circuit while perturbing the tuning of the nulling loop;
      calculating one or more metric values from the data; and
      adjusting the tuning of the error loop based on the one or more metric values.

2. The invention of claim 1, wherein the signal handling equipment is an amplifier and the compensation circuitry linearizes the output of the amplifier.

3. The invention of claim 1, wherein the nulling loop is tuned by:
   applying an input signal to the signal processing circuit, wherein the nulling loop generates an error signal by comparing the output of the signal handling equipment to the input signal; and
   adjusting amplitude and/or phase of a signal applied to the signal handling equipment to minimize the error signal.

4. The invention of claim 1, wherein the error loop is tuned by:
   applying an input signal to the signal processing circuit, wherein:
      the nulling loop generates an error signal by comparing the output of the signal handling equipment to the input signal; and
      the error loop amplifies the error signal to generate the feed-forward compensation signal;
   implementing a set of perturbations to amplitude and/or phase of a signal applied to the signal handling equipment;
   measuring amplitude or power level of the output signal from the signal processing circuit for each perturbation in the set;

calculating a metric data point from the amplitudes or power levels for the set of perturbations;

adjusting amplitude and/or phase of the error signal prior to being amplified based on the metric data point; and repeating, one or more times, the perturbing, measuring, calculating, and adjusting based on the adjusted amplitude and/or phase of the error loop.

5. The invention of claim 4, wherein the metric data point is calculated based on a sum of squares of differences between the power of the output signal at each perturbation in the set and the power of the output signal corresponding to an unperturbed tuning of the nulling loop.

6. The invention of claim 5, wherein the metric data point is calculated based on a logarithm of the sum of the squares of the differences.

7. The invention of claim 4, wherein:

for one or more initial iterations, the metric data point is calculated based on full set of perturbations; and for one or more subsequent iterations, the metric data point is calculated based on a reduced set of perturbations, where the reduce set has fewer perturbations than the full set.

8. The invention of claim 7, wherein the reduced set is selected based on the perturbations in the full set having the greatest affect on the amplitude or power level of the output signal from the signal processing circuit.

9. The invention of claim 1, wherein the tuning of the error loop is adjusted based on a gradient of the one or more metric values.

10. The invention of claim 1, wherein a controller in the signal processing circuit controls and implements the tuning method.

11. A signal processing circuit comprising:

(a) signal handling equipment;

(b) feed-forward compensation circuitry adapted to generate and apply a feed-forward compensation signal to an output of the signal handling equipment to generate an output signal for the signal processing circuit; and (c) a controller adapted to tune the signal processing circuit by:

tuning a nulling loop of the signal processing circuit; and iteratively tuning an error loop of the signal processing circuitry by:

generating data corresponding to the output signal from the signal processing circuit while perturbing the tuning of the nulling loop;

calculating one or more metric values from the data; and adjusting the tuning of the error loop based on the one or more metric values.

12. The invention of claim 11, wherein the signal handling equipment is an amplifier and the compensation circuitry linearizes the output of the amplifier.

13. The invention of claim 11, wherein the nulling loop is tuned by:

applying an input signal to the signal processing circuit, wherein the nulling loop generates an error signal by comparing the output of the signal handling equipment to the input signal; and adjusting amplitude and/or phase of a signal applied to the signal handling equipment to minimize the error signal.

14. The invention of claim 11, wherein the error loop is tuned by:

applying an input signal to the signal processing circuit, wherein:

the nulling loop generates an error signal by comparing the output of the signal handling equipment to the input signal; and the error loop amplifies the error signal to generate the feed-forward compensation signal;

implementing a set of perturbations to amplitude and/or phase of a signal applied to the signal handling equipment;

measuring amplitude or power level of the output signal from the signal processing circuit for each perturbation in the set;

calculating a metric data point from the amplitudes or power levels for the set of perturbations;

adjusting amplitude and/or phase of the error signal prior to being amplified based on the metric data point; and repeating, one or more times, the perturbing, measuring, calculating, and adjusting based on the adjusted amplitude and/or phase of the error loop.

15. The invention of claim 14, wherein the metric data point is calculated based on a sum of squares of differences between the power of the output signal at each perturbation in the set and the power of the output signal corresponding to an unperturbed tuning of the nulling loop.

16. The invention of claim 15, wherein the metric data point is calculated based on a logarithm of the sum of the squares of the differences.

17. The invention of claim 14, wherein:

for one or more initial iterations, the metric data point is calculated based on full set of perturbations; and for one or more subsequent iterations, the metric data point is calculated based on a reduced set of perturbations, where the reduce set has fewer perturbations than the full set.

18. The invention of claim 17, wherein the reduced set is selected based on the perturbations in the full set having the greatest affect on the amplitude or power level of the output signal from the signal processing circuit.

19. The invention of claim 11, wherein the tuning of the error loop is adjusted based on a gradient of the one or more metric values.

20. The invention of claim 1, wherein, during the iterative tuning of the error loop:

at least one metric value is generated for each of two or more different perturbations of the tuning of the nulling loop; and the tuning of the error loop is adjusted based on a statistical measure derived from the two or more metric values.

21. The invention of claim 11, wherein, during the iterative tuning of the error loop:

at least one metric value is generated for each of two or more different perturbations of the tuning of the nulling loop; and the tuning of the error loop is adjusted based on a statistical measure derived from the two or more metric values.

* * * * *